(12) United States Patent
Zeng et al.

(10) Patent No.: US 10,191,571 B2
(45) Date of Patent: Jan. 29, 2019

(54) SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Ting Zeng, Beijing (CN); Kefeng Li, Beijing (CN); Taofeng Xie, Beijing (CN); Tsungchieh Kuo, Beijing (CN); Shuncheng Zhu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/654,290

(22) Filed: Jul. 19, 2017

(65) Prior Publication Data

US 2018/0024664 A1    Jan. 25, 2018

(30) Foreign Application Priority Data

Jul. 22, 2016   (CN) .......................... 2016 1 0587410

(51) Int. Cl.
| | |
|---|---|
| *H01L 21/00* | (2006.01) |
| *G06F 3/041* | (2006.01) |
| *H01L 27/12* | (2006.01) |
| *G02F 1/1362* | (2006.01) |
| *H01L 21/77* | (2017.01) |
| *G02F 1/1333* | (2006.01) |

(52) U.S. Cl.
CPC ............ *G06F 3/041* (2013.01); *G02F 1/1362* (2013.01); *G02F 1/13338* (2013.01); *H01L 21/77* (2013.01); *H01L 27/12* (2013.01); *G02F 2201/12* (2013.01); *G06F 2203/04103* (2013.01)

(58) Field of Classification Search
CPC ...... H01L 21/77; H01L 21/12; H01L 27/3272
See application file for complete search history.

(56) References Cited

U.S. PATENT DOCUMENTS

| 4,704,002 A | 11/1987 | Kikuchi et al. | |
|---|---|---|---|
| 2009/0072343 A1* | 3/2009 | Ohnuma ............ | H01L 21/2007 257/506 |
| 2014/0374746 A1* | 12/2014 | Lee ..................... | H01L 29/7869 257/43 |

(Continued)

FOREIGN PATENT DOCUMENTS

CN    1070052 A    3/1993

OTHER PUBLICATIONS

First Office Action for Chinese Application No. 201610587410.X, dated Jul. 23, 2018, 7 Pages.

*Primary Examiner* — Jaehwan Oh
*Assistant Examiner* — John M Parker
(74) *Attorney, Agent, or Firm* — Brooks Kushman P.C.

(57) ABSTRACT

A substrate and a display device are provided. The substrate includes a base and a signal line arranged on the base. The signal line includes at least two main film layers and a first additional film layer arranged between every two adjacent main film layers, wherein an electrical conductivity of the main film layer is larger than that of the first additional film layer; and a crystallinity of the main film layer is lower than that of the first additional film layer.

15 Claims, 1 Drawing Sheet

(56) References Cited

U.S. PATENT DOCUMENTS

2017/0059952 A1\* 3/2017 Itou .................. G02F 1/136286
2017/0177132 A1\* 6/2017 Ishizaki ................ G06F 3/0412
2017/0250199 A1\* 8/2017 Odaka ................ H01L 27/1222
2017/0272050 A1\* 9/2017 Umeda ............. H03H 9/02102

\* cited by examiner

SUBSTRATE AND DISPLAY DEVICE

CROSS-REFERENCE TO RELATED APPLICATION

The present application claims a priority to Chinese Patent Application No. 201610587410.X filed on Jul. 22, 2016, the disclosure of which is incorporated herein in its entirety by reference.

TECHNICAL FIELD

The present disclosure relates to a technical field of display, and in particular to a substrate and a display device including the substrate.

BACKGROUND

With constant updating of touch control techniques and constant optimization of development and manufacture processes of new materials, touch control performances (including touch control sensitivity) are greatly increased. Requirements on user experience reach a new height. Touch control techniques used in various touch control electronics include One Glass Solution (OGS), In-cell and On-cell. The OGS is mainly used in large-sized products due to touch control sensitivity thereof, while the On-cell/In-cell are mainly used in small-sized products. In order to reduce costs of the large-sized OGS and other touch control modules having high performance requirements, pure aluminum target materials with a price advantage and low sheet resistance characteristic are usually used in related arts. Since a pitch time of a rotating target device is short, and a thickness of a film coated each time has a limit value, multiple times of coating are needed to be performed to a metal film with low sheet resistance in the large-size OGS and other touch control modules with high performance requirements. However, when the pure aluminum is applied to the touch control module, a quality of the metal film coated for multiple times by means of the pure aluminum is poor, and a probability of generating hillocks is obviously increased, which probably causes a poor quality of a screen.

SUMMARY

Embodiments of the present disclosure provide a substrate and a display device, so as to solve problems that the metal film layers with low sheet resistance in the large-size OGS and other touch control modules having high performance requirements have a poor film quality when the metal film layers are coated multiple times, a probability of generating hillocks is obviously increased, and a poor quality of screen.

The embodiments of the present disclosure provide a substrate. The substrate includes a base and a signal line arranged on the base, wherein the signal line includes at least two main film layers and a first additional film layer arranged between every two adjacent main film layers of the at least two main film layers, an electrical conductivity of each of the at least two main film layers is larger than that of the first additional film layer; and a crystallinity of each of the at least two main film layers is lower than that of the first additional film layer.

The signal line of the substrate of the present disclosure includes at least two main film layers. When the signal line with a low sheet resistance needs to be coated multiple times, adding the first additional film layer between every two of the at least two main film layers may reduce the probability of generating hillocks on the main film layer to be coated and increase a yield of screens.

Optionally, the signal line further includes at least one of a second additional film layer arranged on one side of the signal line adjacent to the base and a third additional film layer arranged on the other side of the signal line away from the base, wherein the second additional film layer and the third additional film layer are configured to increase an adhesive force of the signal line.

Optionally, an etching rate of each of the at least two main film layers is smaller than any one of an etching rate of the first additional film layer, an etching rate of the second additional film layer and an etching rate of the third additional film layer.

Optionally, a material of the second additional film layer and a material of the third additional film layer are the same as that of the first additional film layer.

Optionally, a material of the first additional film layer, a material of the second additional film layer and a material of the third additional film layer are one or more of molybdenum, chromium and nickel.

Optionally, a material of the main film layer is one or more of aluminum, silver and copper.

Optionally, a thickness of the first additional film layer ranges from 150 angstroms to 350 angstroms.

Optionally, a thickness of the first additional film layer is 350 angstroms.

Optionally, a sheet resistance of the signal line is smaller than 0.2 Ohm.

Optionally, the signal line comprises one or more of a data line, a gate line and a circuit compensation and adjustment line.

The embodiments of the present disclosure further provide a display device which includes the substrate of the embodiments of the present disclosure.

DETAILED DESCRIPTION

Figure 1:
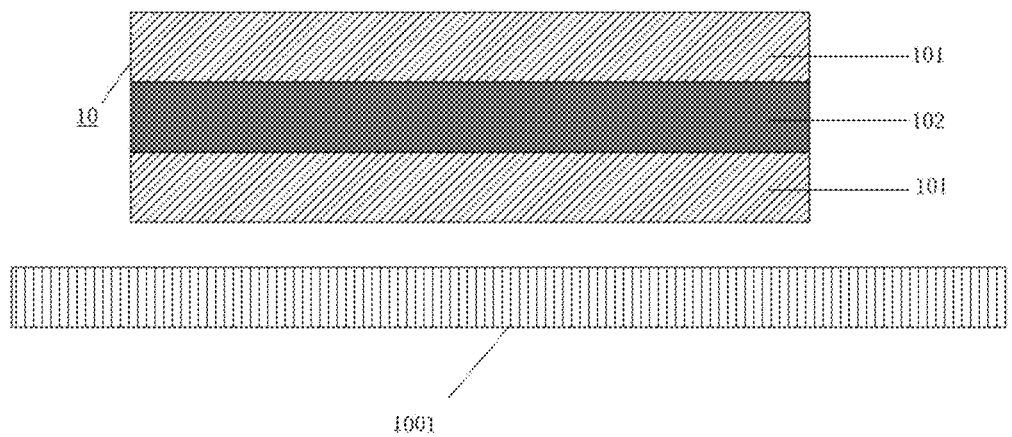
FIG. 1 is a schematic view of an example of a film structure of a signal line provided by embodiments of the present disclosure.

Embodiments of the present disclosure will be described completely and clearly hereinafter in conjunction with drawings of the present disclosure. Apparently, the described embodiments are merely a part of the embodiments of the present disclosure, rather than all embodiments. All other embodiments obtained by a person of ordinary skills in the art based on the embodiments of the present disclosure without creative efforts fall within a protection scope of the present disclosure.

Thicknesses, and region sizes and shapes of films in the drawings do not represent true scales between a substrate and signal lines, but are only intended to illustrate contents of the present disclosure.

Signal lines on a substrate in the related arts are redesigned and optimized in the embodiments of the present disclosure by changing structures of the signal lines. The technical solutions of the present disclosure are applicable to any type of substrate, such as an array substrate, an opposite substrate or a touch substrate or the like. Specific structures of the substrate will be described in detail hereinafter.

FIG. 1 is a schematic view of an example of a film structure of a signal line provided by the embodiments of the present disclosure. A substrate 1000 provided by the embodiments of the present disclosure includes a base 1001 and a signal line 10 arranged on the base 1001. The signal line 10 includes at least two main film layers 101 and a first additional film layer 102 arranged between every two adjacent main film layers of the at least two main film layers 101. An electrical conductivity of the main film layer 101 is larger than that of the first additional film layer 102, and a crystallinity of the main film layer 101 is lower than that of the first additional film layer 102.

In implementation, for a metal film layer with low sheet resistance in a large-size OGS and other touch control modules with high performance requirements, if the signal line coated for multiple times includes at least two main film layers 101, then the probability of generating hillocks is obviously increased due to a poor quality of a film structure being coated for multiple times, which probably causes a poor quality of a screen. In the embodiments of the present disclosure, the first additional film layer 102 is arranged between every two adjacent main film layers 101. In order to ensure that the main film layers 101 are the main conductive films, it is required to set the electrical conductivity of the main film layer 101 to be much larger than that of the first additional film layer 102. However, in order to make the coated film structure more smooth and prevent generation of the hillocks, a material with a crystallinity higher than that of the main film layer 101 needs to be selected as the first additional film layer 102.

As shown in FIG. 1, the first additional film layer 102 is arranged between the middle of two main film layers 101, i.e., between an upper main film layer 101 and a lower main film layer 101 of every two adjacent main film layers 101. Because the crystallinity of the first additional film layer 102 is higher than that of the main film layer 101, the probability of generating hillocks on the main film layer to be coated may be reduced, so as to improve a yield of screens. For example, when a pure aluminum is used to manufacture the signal line 10, a layer of aluminum may be coated as the main film layer 101 at first. Then, a layer of molybdenum with a higher crystallinity (i.e., the first additional film layer 102) may be coated on the main film layer 101, so as to increase a smoothness of the generated film structure, and then a layer of aluminum (i.e., the main film layer 101 located at a upper layer) is coated on the layer of molybdenum. Compared with directly coating aluminum on an aluminum layer, the probability of generating hillocks may be reduced greatly.

Because the present disclosure mainly directs at improving a structure of the signal line on the substrate, a schematic view of the substrate is shown in the drawings of the present disclosure only. The type of the signal line and the position of the signal line arranged on the substrate may be not limited herein since the type and the position may be configured as required. The signal line provided by the embodiments of the present disclosure may be any signal line that needs to be coated multiple times on the substrate. Optionally, the signal line includes one or more of the following: a data line, a gate line, a circuit compensation and regulation line, or other lines. The method of the present disclosure may be adopted to any signal line that is arranged on the substrate and needs to be coated multiple times.

In implementation, in order to increase an adhesion force of the main film layer 101, two additional film layers may be arranged on an upper side and a lower side of the film structure including two main film layers 101, respectively.

Figure 2:
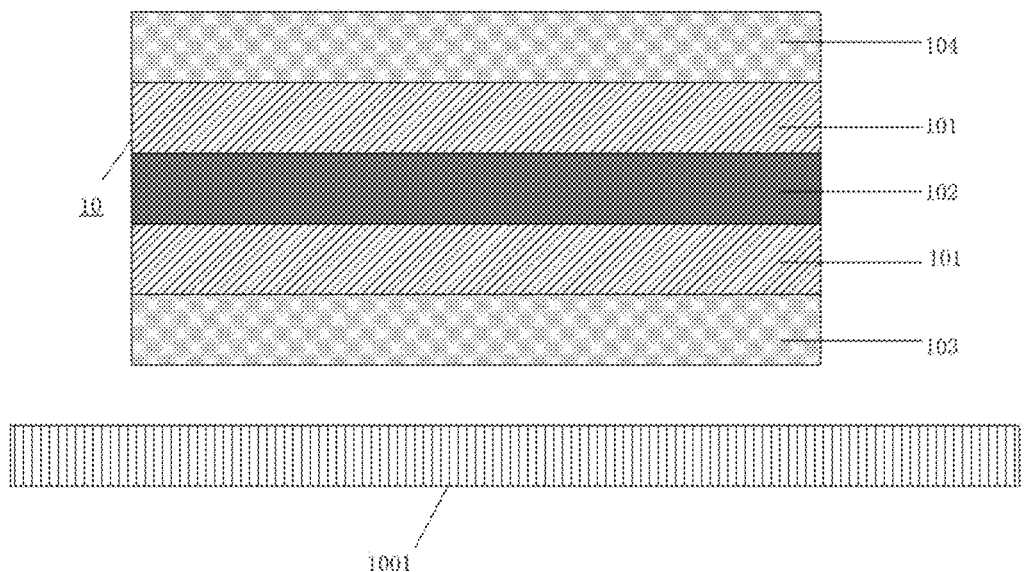
FIG. 2 is a schematic view of another example of a film structure of a signal line provided by embodiments of the present disclosure.

FIG. 2 is a schematic view of another example of a film structure of a signal line provided by embodiments of the present disclosure. Optionally, the signal line 10 further includes at least one of a second additional film layer 103 and a third additional film layer 104. The second additional film layer 103 is arranged on one side of the signal line 10 adjacent to the base 1001 and the third additional film layer 104 is arranged on the other side of the signal line 10 away from the base 1001, wherein the second additional film layer 103 and the third additional film layer 104 are configured to increase the adhesion fore of the signal line 10.

Beside reducing the probability of generating hillocks, the first additional film layer 102 in the middle of the signal line as shown in FIG. 2 may improve a problem of excessively etching metals at a bottom layer at the time of etching various film layers after the second additional film layer 103 and the third additional film layer 104 are arranged.

Optionally, an etching rate of the main film layer 101 is smaller than that of the first additional film layer 102, that of the second additional film layer 103, and that of the third additional film layer 104. Because the etching rate of the main film layer 101 among the film layers forming the signal line 10 is minimum, i.e., the etching rate of the first additional film layer is larger than that of the main film layer, the first additional film layer 102 will be etched more quickly than the main film layer 101 during etching, so that a contact area between an etchant and the main film layer is increased, thus accelerating the etching of the main film layer.

As for a structure of molybdenum-aluminum-aluminum-molybdenum or a structure of molybdenum-aluminum-aluminum-molybdenum-molybdenum-oxide, the molybdenum is etched quickly and the aluminum is etched slowly during etching since an etching rate of the molybdenum is larger than that of the aluminum, so that the metal at the bottom layer will be etched excessively. In the present disclosure, the first additional film layer is added between the main film layers of the signal line, for example, the signal line is arranged to have a structure of molybdenum-aluminum-molybdenum-aluminum-molybdenum or a structure of molybdenum-aluminum-molybdenum-aluminum-molybdenum-molybdenum-oxide. Because a layer of molybdenum with a larger etching rate is added between the two layers of aluminum with a smaller etching rate, the etching of the main film layer may be accelerated, and a phenomenon of excessive etching of the metal at the bottom layer may be prevented.

Although adding the first additional film layer may reduce the probability of generating hillocks in the main film layer and improve the phenomenon of excessive etching of the metal at the bottom layer, a thickness of the first additional film layer also needs to be set according to requirements, and should not be too large. Optionally, the thickness of the first additional film layer ranges from 150 angstroms to 350 angstroms. Optionally, the thickness of the first additional film layer is 350 angstroms. Because the etching is too fast when the thickness of the first additional film layer 102 is too large, the thickness of the first additional film layer 102 may be set to be in the range of 150 angstroms to 350 angstroms. While the thickness of the first additional film layer 102 is set to be in the range of 150 angstroms to 350 angstroms, the effects of reducing the probability of generating hillocks and improving the phenomenon of excessive etching of the metal at the bottom layer are optimal.

Materials of the first additional film layer 102, the second additional film layer 103 and the third additional film layer 104 may be selected according to requirements. Optionally, both of the materials of the second additional film layer 103 and the third additional film layer 104 are the same as that of the first additional film layer 102.

In implementation, the materials of the first additional film layer 102, the second additional film layer 103 and the third additional film layer 104 may be the same. For example, all of the materials may be molybdenum. The materials of the first additional film layer 102, the second additional film layer 103 and the third additional film layer 104 may also be different according to requirements. Optionally, the material of the first additional film layer 102, the material of the second additional film layer 103 or the material of the third additional film layer 104 is one or more of the following: molybdenum, chromium and nickel. The materials of the first additional film layer 102, the second additional film layer 103 and the third additional film layer 104 are not defined specifically, as long as the first additional film layer, the second additional film layer and the third additional film layer have larger etching rate and a smaller electrical conductivity than those of the main film layer.

The material of the main film layer 101 may be a material used for manufacturing a metal signal line, for example, a material used for manufacturing a gate line and/or a data line or the like, which is not limited herein. Optionally, the material of the main film layer is one or more of the following: aluminum, silver and copper.

In the present disclosure, since both reducing the probability of generating hillocks and improving the phenomenon of excessive etching of the metal at the bottom layer direct at a metal layer that is subjected to film-coating processes twice or more times and has a larger thickness, a smaller sheet resistance may be selected for the signal line according to requirements. Optionally, the sheet resistance of the signal line is smaller than 0.2 Ohm. Because a thickness of a metal film layer having a sheet resistance larger than 0.2 Ohm is smaller usually, the effects of the method according to the present disclosure are not obvious. The present disclosure is generally applicable to a signals line with a sheet resistance smaller than 0.2 Ohm.

In implementation, the above signal line may be coated through any film coating method. Optionally, the foregoing signal line may be manufactured using a rotating target with a higher utilization factor. Meanwhile, because the pitch time of the rotating target is short, the thickness of the coated film has a limit value, and the film is needed to be coated multiple times. Additional film layers may be set for the signal line provided by the embodiments of the present disclosure during film coating.

Based on the same concept, the embodiments of the present disclosure further provide a display device. The display device includes the foregoing substrate provided by the embodiments of the present disclosure. Because the principles of the display device for solving problems are similar to that of the substrate provided in the embodiments of the present disclosure, the implementation of the display device may refer to the implementation of the substrate, and will not be repeated herein.

In conclusion, the signal line in the substrate provided by the embodiments of the present disclosure at least includes two main film layers. When the signal line with low sheet resistance needs to be coated multiple times, adding the first additional film layer with a higher crystallinity may reduce the probability of generating hillocks in the main film layer to be coated and increase a yield of screens.

Apparently, various modifications and variations may be made by those skilled in the art without away from the spirit and scope of the present disclosure. Thus, the present disclosure is also intended to cover such modifications and variations that fall within the scope of the present disclosure and the equivalents thereof.

What is claimed is:

1. A substrate, comprising:
a base; and
a signal line arranged on the base,
wherein the signal line comprises at least two main film layers, a first additional film layer arranged between every two adjacent main film layers of the at least two main film layers, and at least one of a second additional film layer arranged on one side of the signal line adjacent to the base and a third additional film layer arranged on the other side of the signal line away from the base, wherein an electrical conductivity of each of the at least two main film layers is larger than that of the first additional film layer; and a crystallinity of each of the at least two main film layers is lower than that of the first additional film layer, and the second additional film layer and the third additional film layer are configured to increase an adhesive force of the signal line, and the second additional film layer directly contacts an entirety of a surface of the signal line on the one side of the signal line adjacent to the base and has a same outermost boundary as that of the signal line, and the third additional film layer contacts an entirety of a surface of the signal line on the other side of the signal line away from the base and has a same outermost boundary as that of the signal line.

2. The substrate according to claim 1, wherein an etching rate of each of the at least two main film layers is smaller than any one of an etching rate of the first additional film layer, an etching rate of the second additional film layer and an etching rate of the third additional film layer.

3. The substrate according to claim 2, wherein the signal line comprises one or more of a data line, a gate line and a circuit compensation and adjustment line.

4. The substrate according to claim 1, wherein a material of the second additional film layer and a material of the third additional film layer are the same as that of the first additional film layer.

5. The substrate according to claim 4, wherein the signal line comprises one or more of a data line, a gate line or a circuit compensation and adjustment line.

6. The substrate according to claim 1, wherein a material of the first additional film layer, a material of the second additional film layer and a material of the third additional film layer are one or more of molybdenum, chromium and nickel.

7. The substrate according to claim 6, wherein the signal line comprises one or more of a data line, a gate line and a circuit compensation and adjustment line.

8. The substrate according to claim 1, wherein a material of the main film layer is one or more of aluminum, silver and copper.

9. The substrate according to claim 8, wherein the signal line comprises one or more of a data line, a gate line and a circuit compensation and adjustment line.

10. The substrate according to claim 1, wherein a thickness of the first additional film layer ranges from 150 angstroms to 350 angstroms.

11. The substrate according to claim 10, wherein the signal line comprises one or more of a data line, a gate line and a circuit compensation and adjustment line.

12. The substrate according to claim 1, wherein a thickness of the first additional film layer is 350 angstroms.

13. The substrate according to claim 1, wherein a sheet resistance of the signal line is smaller than 0.2 Ohm.

14. The substrate according to claim 1, wherein the signal line comprises one or more of a data line, a gate line and a circuit compensation and adjustment line.

15. A display device, comprising:
the substrate according to claim 1.

* * * * *